United States Patent
Guyot et al.

(10) Patent No.: US 9,367,483 B2
(45) Date of Patent: Jun. 14, 2016

(54) ACOUSTICALLY SECURE PHASE CHANGE MEMORY DEVICES

(71) Applicant: HGST Netherlands B.V., Amsterdam (NL)

(72) Inventors: Cyril Guyot, San Jose, CA (US); Dejan Vucinic, San Jose, CA (US); Luiz Franca-Neto, Sunnyvale, CA (US)

(73) Assignee: HGST Netherlands B.V., Amsterman (NL)

( * ) Notice: Subject to any disclaimer, the term of this patent is extended or adjusted under 35 U.S.C. 154(b) by 107 days.

(21) Appl. No.: 14/096,921

(22) Filed: Dec. 4, 2013

(65) Prior Publication Data
US 2015/0154120 A1 Jun. 4, 2015

(51) Int. Cl.
*G06F 12/14* (2006.01)
*G11C 13/00* (2006.01)
*G06F 12/02* (2006.01)

(52) U.S. Cl.
CPC ........ *G06F 12/1408* (2013.01); *G11C 13/0004* (2013.01); *G11C 13/0059* (2013.01); *G11C 13/0069* (2013.01); *G11C 13/0097* (2013.01); *G06F 12/0238* (2013.01); *G06F 2212/1052* (2013.01)

(58) Field of Classification Search
CPC ................... G06F 12/1408; G06F 2212/1052; G11C 13/0059; G11C 13/0097; G11C 13/0069
See application file for complete search history.

(56) References Cited

U.S. PATENT DOCUMENTS

| | | | |
|---|---|---|---|
| 7,471,556 B2 * | 12/2008 | Chow et al. | 365/163 |
| 2003/0185394 A1 * | 10/2003 | Ohbi et al. | 380/201 |
| 2003/0235126 A1 * | 12/2003 | Kawakami et al. | 369/53.22 |
| 2008/0255839 A1 * | 10/2008 | Larri et al. | 704/238 |
| 2010/0076793 A1 * | 3/2010 | Goldstein et al. | 705/4 |

OTHER PUBLICATIONS

Daniel Genkin, Adi Shamir, Eran Tromer. "RSA Key Extraction via Low-Bandwidth Acoustic Cryptanalysis", Dec. 18, 2013.*
Bruce Schneier, "Acoustic Cryptanalysis", Dec. 19, 2013 at 6:29 AM.*

* cited by examiner

*Primary Examiner* — Amir Mehrmanesh

(57) ABSTRACT

Systems, methods, and firmware for operating data storage devices and storage processors are provided herein. In one example, a data storage device is provided. The data storage device includes phase change media on which to write data, and a processing system configured to identify a write process to at least obfuscate an acoustic signature associated with writing the data on the phase change media and write the data to the phase change media in accordance with the write process.

12 Claims, 6 Drawing Sheets

ACOUSTICALLY SECURE PHASE CHANGE MEMORY DEVICES

TECHNICAL FIELD

Aspects of the disclosure are related to the field of data storage systems, and in particular, writing and erasing of data on phase change storage media in data storage devices and systems.

TECHNICAL BACKGROUND

Computer and network systems such as personal computers, workstations, server systems, and cloud storage systems, typically include data storage systems for storing and retrieving data. These data storage systems can include data storage devices, such as phase change media devices, hard disk drives, solid state storage devices, tape storage devices, and other mass storage devices.

Phase change memory can be employed in various discrete phase change memory (PCM) devices or included in integrated circuit systems to store data in a computing system or storage system. For example, a motherboard or other circuit board of a computing or processing system can employ one or more phase change memory devices to store data related to the operation of the computing or processing system.

In examples of phase change storage media, such as phase change memory devices, phase change memory cells are employed to store data bits arrayed in chalcogenide glass material. These phase change memory cells can be changed from a crystalline state to an amorphous state, and vice versa, to store 1s and 0s associated with bits of data. The phase change storage media typically employs resistive heaters or a laser system to selectively heat individual phase change cells to change bits between the amorphous and crystalline states. The crystalline state typically requires a slower heating period than the amorphous state.

When data is written to or erased from a phase change memory device, the write or erase process can cause the phase change media to emit acoustic signals. These acoustic signals are typically correlated to the rapid change of physical state of the chalcogenide glass material, and can be on the order of microseconds for each written or erased bit. Unfortunately, these acoustic signals can lead to a less secure data environment by allowing for eavesdropping using ultrasonic acoustic pickup devices. For example, a microphone mounted in proximity to a phase change memory device might be able to monitor the data written to or erased from the phase change memory device.

Overview

To provide enhanced operation of phase change storage media associated with data storage devices, various systems, methods, and firmware are provided herein. In some examples, these systems, methods, and firmware can provide for data storage devices that include phase change media on which to write data, and a processing system configured to identify a write process to at least obfuscate an acoustic signature associated with writing the data on the phase change media and write the data to the phase change media in accordance with the write process. In further examples, the processing system is configured to identify an erase sequence to at least obfuscate an acoustic signature associated with erasing data on the phase change media, and erase the data on the phase change media in accordance with the erase sequence.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Various systems, methods, and firmware are provided for enhanced operation of phase change storage media associated with data storage devices. This enhanced operation can lead to more secure storage of data on phase change media devices and prevent acoustic eavesdropping of data written to or erased from the phase change media devices.

Figure 1:
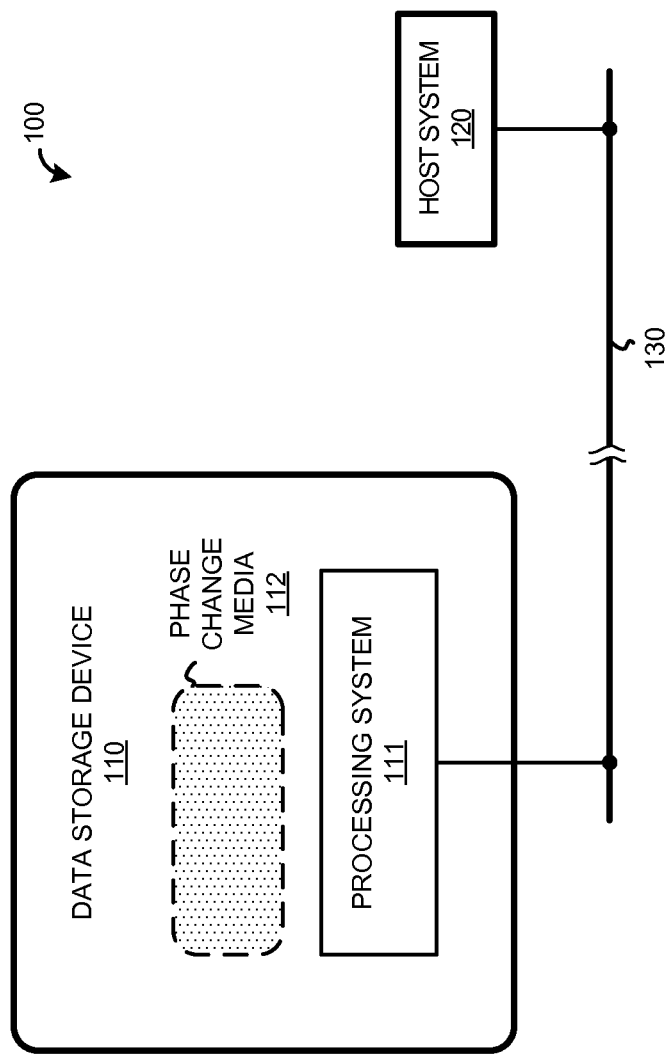
FIG. 1 is a system diagram illustrating a storage system.

In a first example of a storage system, FIG. 1 is presented. FIG. 1 is a system diagram illustrating storage system 100. Storage system 100 includes data storage device 110 and host system 120. Data storage device 110 and host system 120 communicate over bus 130. Although bus 130 is shown in FIG. 1, it should be understood that one or more discrete links can be employed between the elements of storage system 100. In operation, host system 120 can control data storage device 110, such as for storing data, reading data, erasing data, and the like. The data can include user data, system data, cache data, or any data used in a computing or data storage environment.

Data storage device 110 includes processing system 111 and one or more phase change media 112. Processing system 111 and phase change media 112 are communicatively coupled, and processing system 111 controls the operation of phase change media 112. Although only processing system 111 and phase change media 112 are included for data storage device 110 in FIG. 1 for clarity, it should be understood that further elements can be included such as communication interfaces, media control systems, power systems, firmware, further storage devices, further storage media, and other elements, including combinations and variations thereof.

Figure 2:
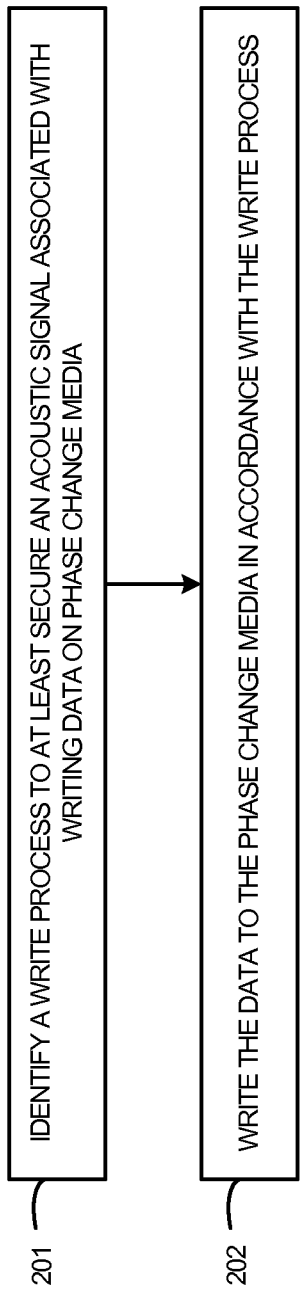
FIG. 2 is a flow diagram illustrating a method of operation of a data storage device.

To illustrate example operations for storage system 100, FIG. 2 is presented. FIG. 2 is a flow diagram illustrating a method of operation of data storage device 110. The operations of FIG. 2 are referenced below parenthetically. In FIG. 2, data storage device 110 identifies (201) a write process to at least secure an acoustic signal associated with writing data on phase change media 112. The write process can be determined in response to a write command received over bus 130 from hose system 120. The write command can be accompanied by data to be written for storage by data storage device 110. In this example, processing system 111 identifies the write process, which can include determining a write sequence for data received over bus 130 from host system 120. In other examples, instead of a write process, processing system 111 can identify an erase process responsive to an erase command received over bus 130. The write and erase processes can be collectively referred to as 'modify' processes.

As discussed herein, the modifying of data by writing or erasing of data on phase change media 112 can produce an acoustic signal representative of the bits of data that are modified. To secure the acoustic signal, data storage device 110 can obfuscate an acoustic signature that the write or erase process produces. The obfuscation can include one or more modifications to a conventional write or erase process that changes an acoustic signal produced by modifying data on phase change media 112 to an acoustic signal that is less able to be eavesdropped. In further examples, an encryption process can be employed to secure the acoustic signal.

Data storage device 110 writes (202) the data to phase change media 112 in accordance with the write process. The write process can include changing data on phase change media 112 according to the write process, such as writing '1' or '0' bits to phase change media 112 to store the data. As discussed above, the write process can include obfuscation features to secure an acoustic signal produced during the writing of bits to phase change media 112. These acoustic signals are typically correlated to the rapid change of physical state of the chalcogenide glass material, and can be on the order of microseconds for each written or erased bit. Although processing system 111 can write the data in this example, it should be understood that further elements can instead write the data, such as media control elements, word line control elements, heating elements, and other data storage and media control elements.

Figure 3:
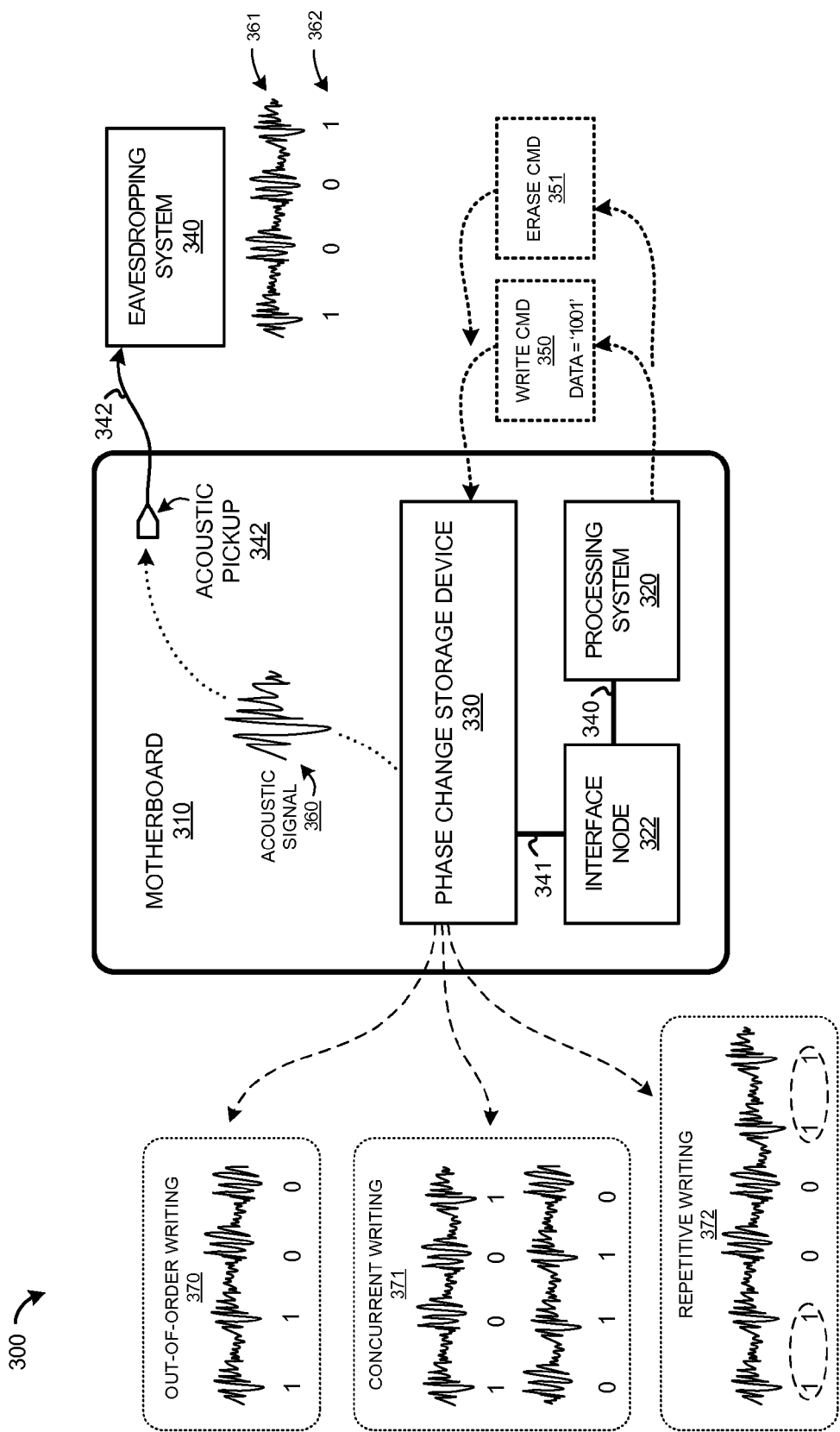
FIG. 3 is a system diagram illustrating a storage system.

As a further example of a data storage system, FIG. 3 is presented. FIG. 3 is a system diagram illustrating storage system 300. Storage system 300 includes motherboard 310, processing system 320, interface node 322, phase change storage device 330, eavesdropping system 340, and acoustic pickup 342. In this example, processing system 320, interface node 322, phase change storage device 330, and acoustic pickup 342 are coupled to motherboard 310, such as via soldered pins or balls of associated integrated circuit and discrete devices. Other coupling mechanisms can be employed, such as fasteners, adhesives, and the like.

Phase change storage device 330 and interface node 322 communicate over bus 341. Bus 341 can include any storage interface or communication interface, such as Peripheral Component Interconnect Express (PCIe) interface, serial ATA, Serial Attached Small Computer System Interface (SAS), Integrated Drive Electronics (IDE) interface, ATA interface, Universal Serial Bus (USB) interface, small computer serial interconnect (SCSI), Fiber Channel, serial communication interface, parallel communication interface, wireless interface, or other proprietary communication interfaces, including variations, combinations, and improvements thereof.

Processing system 320 and interface node 322 communicate over link 340, which can comprise an inter-chip communication link or intra-chip communication link (when processing system 320 and interface node 322 are included in the same device). Communication link 340 can comprise a Direct Media Interface (DMI), PCIe interface, serial communication link, parallel communication link, or other communication link, including variations, combinations, and improvements thereof.

Acoustic pickup 342 and eavesdropping system 340 communicate over link 342. Link 342 can include an analog or digital link to transfer an acoustic signal detected by acoustic pickup 342 to eavesdropping system 340. Link 342 can include any intervening networks, links, circuits, amplifiers, digitizers, or other elements.

Phase change storage device 330 can include phase change media, communication interfaces, processing systems, media control elements, among other elements omitted in FIG. 3 for clarity. Phase change storage device 330 can also include a computer readable storage portion, such as computer readable storage element, that includes firmware, logs, databases, settings, or other data for the operation of phase change storage device 330.

Processing system 320 can comprise computing systems, server systems, cloud computing systems, or other processing systems, which can include processing elements, data transfer elements, and user interface elements. In some examples, processing system 320 is a central processing unit of a computing device or computing system. In other examples, processing system 320 also includes memory elements, data storage and transfer elements, controller elements, logic elements, firmware, execution elements, and other processing system components. In yet other examples, processing system 320 comprises a storage controller processor or storage system central processor, such as a microprocessor, microcontroller, system-on-a-chip device, Field Programmable Gate Array (FPGA), or other processing and logic device, including combinations thereof. Processing system 320 can include, or interface with, user interface elements which can allow a user of storage system 300 to control the operations of storage system 300 or to monitor the status or operations of storage system 300. These user interface elements can include graphical or text displays, indicator lights, network interfaces, web interfaces, software interfaces, user input devices, or other user interface elements.

Interface node 322 includes circuitry and elements for handling communications over link 341, such as logic, processing portions, buffers, transceivers, and the like. Interface node 322 can comprise an interconnect device, input/output controller hub, peripheral communication hub, north bridge device, south bridge device, storage array controller, RAID controller, or other communication interface node. Interface node 322 can include interworking functions to translate communications from a first format used over link 340 to a second format used over link 341, including translating among various signaling, voltages, bus widths, serial-to-parallel signaling, parallel-to-serial signaling, data speeds, throughput variations, and the like.

Eavesdropping system 340 comprises acoustic processing systems and equipment. Eavesdropping system 340 can include communication or network interfaces, as well as computer systems, microprocessors, circuitry, cloud-based systems, or some other processing devices or software systems, and can be distributed among multiple processing devices. Examples of eavesdropping system 340 can also include software such as an operating system, logs, databases, utilities, drivers, networking software, and other software stored on a computer-readable medium.

Eavesdropping system 340 receives signals from acoustic pickup 342 which are representative of acoustic signals detected from elements associated with motherboard 310, such as acoustic signal 360 originating from phase change storage device 330. Acoustic pickup 342 includes acoustic sensor elements, such as ultrasonic microphones, as well as acoustic processing elements, such as amplifiers, buffers, analog to digital converter elements, communication interfaces, or other elements to monitor acoustic signals in proximity to motherboard 310 and transfer signals representative of the acoustic signals for delivery to eavesdropping system 340. In some examples, acoustic pickup 342 transfers analog electronic signals representative of the acoustic signals for delivery to eavesdropping system 340, while in other examples, acoustic pickup 342 transfers digital electronic signals representative of the acoustic signals for delivery to eavesdropping system 340. Acoustic pickup 342 can be coupled to physical elements of motherboard 310, such as printed circuit board traces, screws, fasteners, or other element of motherboard 310. In other examples, motherboard 310 is mounted in a case or enclosure and acoustic pickup 342 is coupled to the case or enclosure. In further examples, acoustic pickup 342 is merely positioned in proximity to motherboard 310 or phase change storage device 330. In yet further examples, acoustic pickup 342 is an on-board microphone soldered to motherboard 310 for operational use by processing system 320, and processing system 320 transfers signals representative of the acoustic signals for delivery to eavesdropping system 340 after receiving the signals from acoustic pickup 342.

Figure 4A:
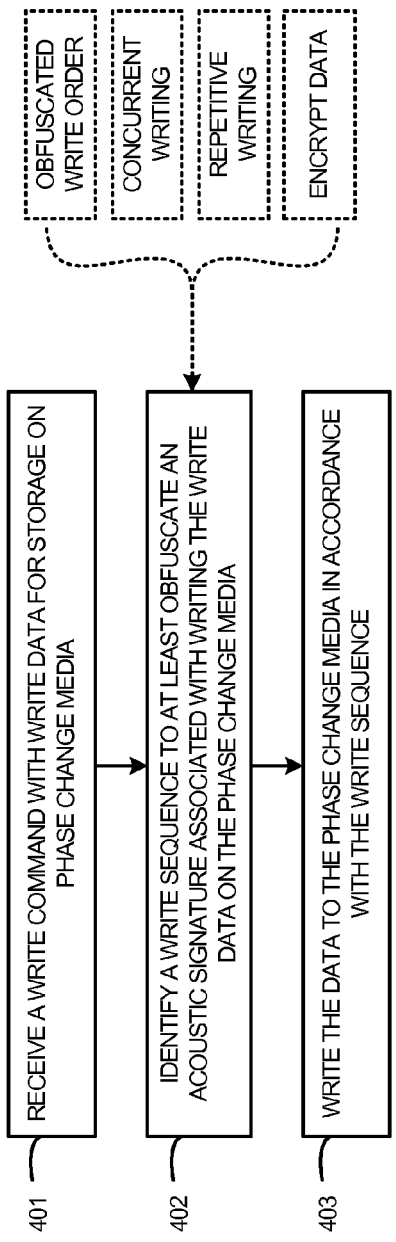
FIG. 4A is a sequence diagram illustrating a method of operation of a storage system.
Figure 4B:
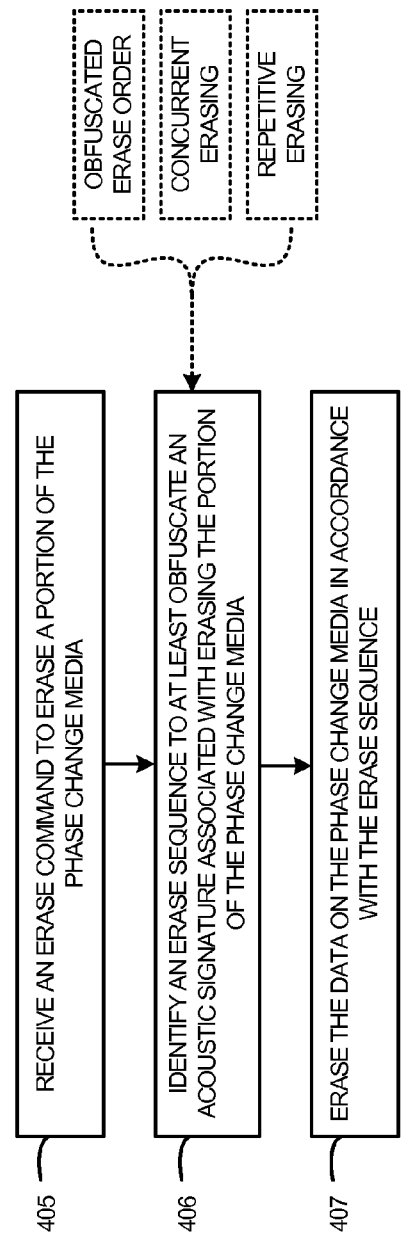
FIG. 4B is a sequence diagram illustrating a method of operation of a storage system.

As an example operation of storage system 300, FIGS. 4A and 4B are presented. FIG. 4A is a flow diagram illustrating an example method for writing of data to phase change storage device 330. FIG. 4B is a flow diagram illustrating an example method for erasing of data on phase change storage device 330. The operations of FIGS. 4A and 4B are referenced below parenthetically.

Although data 'bits' are shown in the examples discussed in FIGS. 3 and 4, it should be understood that a higher-quantity bit groupings or granularities can be employed, such as words, bytes, pages, and the like. The bits discussed in FIGS. 3 and 4 are individually addressable for exemplary purposes, but it should be understood that larger quantities of bits might only be individually addressable, such as word-addressable, byte-addressable, page-addressable, or other bit groupings for each addressable memory location of phase change storage device 330. The operations, elements, processes, and sequences discussed herein apply to bits as well as words, bytes, pages, or other bit groupings and addressability schemes.

In FIG. 4A, a write operation is discussed, specifically, write command 350. Write command 350 is transferred by processing system 320 for writing of data to phase change storage device 330. The write command can be transferred over link 340, interface node 322, and bus 341, and accompanied by data to be written. Phase change storage device 330 receives (401) the write command with the write data for storage on phase change media associated with phase change storage device 330. The data to be written in this example is indicated as '1001' in FIG. 3, although any data can be employed. Write command 350 can also include an address or location at which to store the data in phase change storage device 330.

In a conventional write process, phase change storage device 330 can sequentially write the data to the address associated with write command 350. The write sequence is representative of the order the data was received, such as '1001' as indicated by conventional write sequence 362. Write sequence 362, when executed by phase change storage device 330, emits an ultrasonic acoustic signal into the elements physically coupled to phase change storage device 330 and the surrounding air around phase change storage device 330. The physically coupled elements can include motherboard 310 and likewise acoustic pickup 342. This acoustic signal can be representative of the data written, such as indicated by acoustic signature 361. Data bits with values of '1' produce a different acoustic signature than data bits with values of '0', as indicated by the exemplary acoustic signatures for each bit portion of acoustic signature 361.

However, in FIG. 4A, an obfuscated write process occurs. Specifically, phase change storage device 330 identifies (402) a write sequence to at least obfuscate an acoustic signature associated with writing the write data on the phase change media. The write sequence can include one or more of the alternative sequences or processes included in FIG. 4A or as indicated by processes 370-372 in FIG. 3. Once the write process is identified, phase change storage device 330 writes (403) the data to the phase change media in accordance with the write process.

In a first example write sequence, indicated by process 370 in FIG. 3, an out-of-order write sequence is employed to obfuscate an acoustic signature associated with write command 350. The out-of-order write sequence includes writing bits of the write data to the phase change media in an order selected to obfuscate an acoustic signature associated with writing the data. Write process 370 shows the write data written in an order of '1100' to the phase change media instead of '1001' as received with write command 350. The write order of the bits can vary according to each write command, the write data itself, and the desired obfuscation. It should be understood that the data bits are still written to the correct associated locations or addresses on the phase change media, but the order in which the bits are written to each associated location are done in an out-of-order or obfuscated manner. Thus, the accompanying acoustic signature associated with process 370 has been obfuscated from conventional acoustic signature 361, and eavesdropping system 340 expecting a conventionally ordered write sequence would not properly monitor the write data as written to phase change media of phase change storage device 330. It should be noted that in this first example, a subsequent read command for the data written responsive to write command 350 would not need any special sequencing or ordering to read the data written by process 370, as the data bits had been written to proper locations associated with an address or location indicated by write command 350.

In a second example write sequence, indicated by process 371 in FIG. 3, a concurrent writing process is employed to obfuscate an acoustic signature associated with write command 350. The concurrent writing process includes identifying further data to write concurrently with the data associated with write command 350. For example, phase change storage device 330 can include a buffer or cache to temporarily hold data pending for writing to the phase change media of phase change storage device 330. This data held in the buffer or cache can be used to write concurrently with other subsequently received data. In the example shown in FIG. 3, process 371 includes data associated with write command 350, namely '1001' and further data '0110' which can be from a previous or subsequent write command transferred by processing system 320. The sequence of the data bits are selected so as to write a '1' of the first data concurrent with a '0' of the second data in process 371, thus obfuscating the acoustic signature when the additive acoustic signal of the concurrently written bits propagates outward from the phase change media. The additive acoustic signal can mask the acoustic signature of each individual bit, and eavesdropping system 340 would not properly monitor the write data as written to phase change media of phase change storage device 330. The concurrent writing of bits in process 371 can be associated with different word lines of the phase change media of phase change storage device 330. For example, phase change storage device 330 can include circuitry or equipment to write data to more than one word line concurrently and thus write '1001' and '0110' to different associated word lines. The data selected to write concurrently with the data associated with write command 350 is typically selected to be on a different word line. The order of the data bits can remain in order as shown in FIG. 3 for process 371, or process 371 can be combined with process 370 to further obfuscate acoustic signatures.

In a third example write sequence, indicated by process 372 in FIG. 3, a repetitive writing process is employed to obfuscate an acoustic signature associated with write command 350. The repetitive writing process includes identifying data bits of write command 350 to repeat in writing to the phase change media. Process 372 includes writing '110011' to the phase change media to obfuscate the acoustic signature, where the first '1' and the last '1' are written twice each to the phase change media. It should be understood that each of the repetitive writes are written to the same individual location or address. In phase change media, the writing of the same data bit to the same phase change cell might not produce an acoustic signature as the phase change cell is already set to the same bit. Therefore, in some examples, to repetitively write a bit, the bit is written, changed, and written again to the intended value. For example, to repetitively write a '1', a '1' might be first written, then a '0', then a '1' again which would ultimately write a '1' to the correct location or address, but the acoustic signature of writing a '1' is obfuscated by the repetitive writes to the same location or address.

In yet further examples, encryption on the data itself can be employed. This encryption can have the effect of obfuscating the acoustic signature of the data, but if eavesdropping system 340 was aware of the encryption key, the acoustic signature of the encrypted data can still reveal the unencrypted data by merely decrypting the data monitored acoustically during various write processes. Therefore, one or more of obfuscation processes 370-371 can be employed separately or in conjunction with an encryption process to ensure that even if an encryption key associated with data written to phase change storage device 330 was known or discovered by eavesdropping system 340, the data could not be eavesdropped by an acoustic signature received by acoustic pickup 342.

In FIG. 4B, instead of a write operation as in FIG. 4A, an erase operation is discussed. Erase command 351 is transferred by processing system 320 for erasing of data on phase change storage device 330. The erase command can be transferred over link 340, interface node 322, and bus 341. Phase change storage device 330 receives (405) the erase command. Erase command 351 can also include addresses or locations at which to erase associated data stored on phase change storage device 330.

In a conventional erase process, phase change storage device 330 can sequentially erase the data at the address or addresses associated with erase command 351. The erase sequence is typically used to set or reset bits identified by an address to all '1' or '0'. This erase process can include individual writes of bits already stored by the phase change media, and might include phase change storage device 330 writing a sequence of 1s or 0s to the address specified in erase command 351. Similar to the write processes discussed above, the erase process emits an ultrasonic acoustic signal into the elements physically coupled to phase change storage device 330 and the surrounding air around phase change storage device 330. The physically coupled elements can include motherboard 310 and likewise acoustic pickup 342. This acoustic signal can be representative of the data erased or the data already stored on the phase change media. For example, if the phase change media already stores data as '1001' then erasing this data by overwriting with a series of 1s, i.e. '1111,' might reveal via an acoustic signature that two sequential bits were changed by the erase process, namely the two 0s of the already stored data. Likewise, if the phase change media already stores data as '1001' then erasing this data by overwriting with a series of 0s, i.e. '0000,' might reveal via an acoustic signature that two sequential bits were changed by the erase process, namely the two 1s of the already stored data. In this conventional example, the bits are assumed to be erased in sequence, specifically, the first bit, the second bit, the third, bit, the fourth bit, and so on. It should be understood that a merely reversed erase or write order might still lead to an undesirable acoustic signature.

However, in FIG. 4B, an obfuscated erase process occurs. Specifically, phase change storage device 330 identifies (406) an erase sequence to at least obfuscate an acoustic signature associated with erasing already stored data on the phase change media. The erase sequence can include one or more of the alternative sequences or processes included in FIG. 4B or as indicated by processes 370-372 in FIG. 3 as applied to erase operations instead of write operations. Once the erase process is identified, phase change storage device 330 erases (407) the associated data on the phase change media in accordance with the erase process.

In a first example erase sequence, an out-of-order erase sequence is employed to obfuscate an acoustic signature associated with erase command 351. The out-of-order erase sequence includes erasing bits of the data on the phase change media in an order selected to obfuscate an acoustic signature associated with erasing the data. Assuming initial stored data of '1001' on the phase change media, the out-of-order erase sequence can instead erase the second bit first, the fourth bit second, the first bit third, and the third bit last. Other erase orders can be employed to obfuscate which bits are being erased at any given time. Thus, the accompanying acoustic signature associated with erasing data has been obfuscated from a conventional acoustic signature, and eavesdropping system 340 would not properly monitor the erase process for phase change media of phase change storage device 330.

In a second example erase sequence, a concurrent erasing process is employed to obfuscate an acoustic signature associated with erase command 351. The concurrent erasing process includes identifying further data to erase concurrently with the data associated with erase command 351. For example, phase change storage device 330 can include a buffer or cache to temporarily hold erase commands pending for erasing portions of the phase change media of phase change storage device 330. These commands held in the buffer or cache can be used to erase concurrently with other subsequently received erase commands. For example, a first erase command might erase a first location or address while a second erase command might erase a second location or address, and these erase commands are performed concurrently to obfuscate which data is getting erased by at least obfuscating the acoustic signature when the additive acoustic signal of the concurrently erased bits propagates outward from the phase change media. The additive acoustic signal can mask the acoustic signature of each individual bit, and eavesdropping system 340 would not properly monitor the erase data as erased from phase change media of phase change storage device 330. The concurrent erasing of bits can be associated with different word lines of the phase change media of phase change storage device 330. For example, phase change storage device 330 can include circuitry or equipment to erase data to more than one word line concurrently. The data selected to erase concurrently with the data associated with erase command 351 is typically selected to be on a different word line. Although not required, in some examples, a read operation is performed to read the data to be erased before the concurrent erase process occurs so that phase change device 330 can know which bits of data to erase concurrently.

In a third example erase sequence, indicated by process 372 in FIG. 3, a repetitive erasing process is employed to obfuscate an acoustic signature associated with erase command 351. The repetitive erasing process includes identifying data bits of erase command 351 to repeat in erasing from the phase change media to obfuscate the acoustic signature. It should be understood that each of the repetitive erases are to the same individual location or address. In phase change media, the erasing of the same data bit to the same phase change cell might not produce a change in acoustic signature if the phase change cell is already set to the same bit. Therefore, in some examples, to repetitively erase a bit, the bit is erased, changed, and erased again to the intended erased value. For example, to repetitively erase a '1', a '0' might be first written, then a '1', then a '0' again which would ultimately erase a '1' from the correct location or address but the acoustic signature of erasing a '1' is obfuscated by the repetitive erases to the same location or address.

Figure 5:
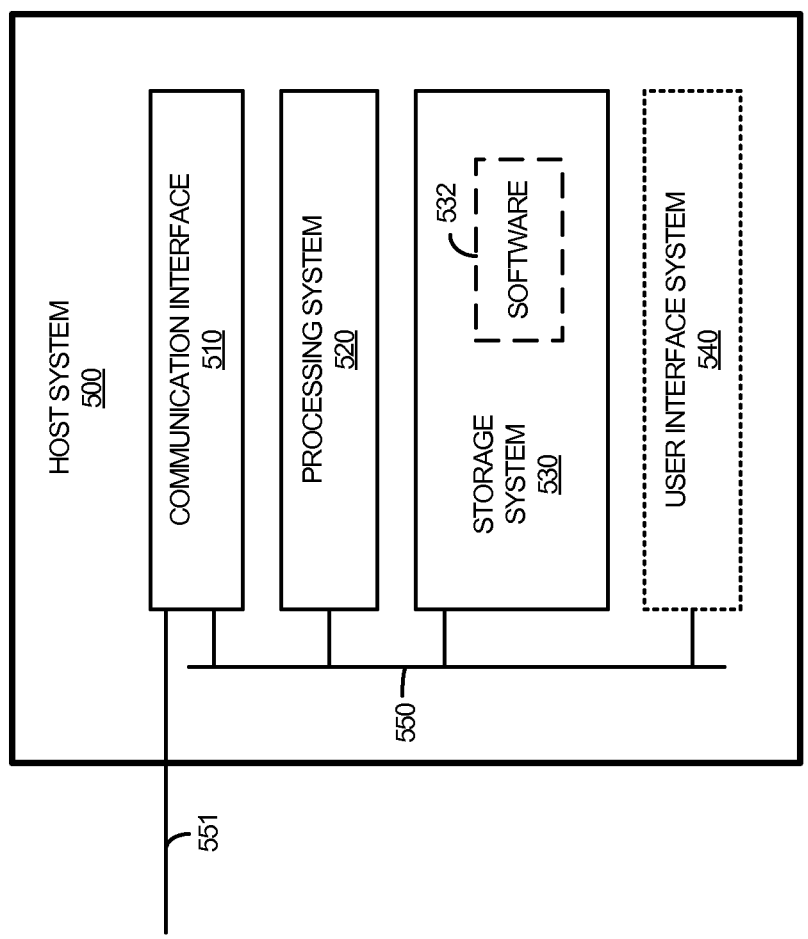
FIG. 5 is a block diagram illustrating a host system.

FIG. 5 is a block diagram illustrating host system 500. Host system 500 can include equipment and systems as discussed herein for host system 120 in FIG. 1, processing system 320 of FIG. 3, or interface node 322 of FIG. 3, although variations are possible. Host system 500 includes communication interface 510, processing system 520, storage system 530, and optionally, user interface system 540. In operation, processing system 520 is operatively linked to communication interface 510, storage system 530, and user interface system 540 by bus 550. It should be understood that discrete links can be employed, such as network links or other circuitry. Host system 500 can be distributed or consolidated among equipment or circuitry that together forms the elements of host system 500. Host system 500 can optionally include additional devices, features, or functionality not discussed here for purposes of brevity.

Communication interface 510 includes one or more interfaces for communicating with communication networks, data busses, data links, or other devices, such as bus 130 of FIG. 1 or links 340-341 of FIG. 3. The interfaces can include any serial or parallel digital interfaces, or other communication and data interfaces, including combinations, variations, and improvements thereof. Examples of communication interface 510 include logic, transmission gates, buffers, network interface card equipment, transceivers, modems, and other communication circuitry. In this example, communication interface 510 communicates over at least link 551. Link 551 can include any communication link as described herein, such as that described for link 130 in FIG. 1 or links 340-341 in FIG. 3.

Processing system 520 can comprise one or more microprocessors and other circuitry that retrieves and executes software 532 from storage system 530. Processing system 520 can be implemented within a single processing device, but can also be distributed across multiple processing devices or sub-systems that cooperate in executing program instructions. Examples of processing system 520 include general purpose central processing units, application specific processors, and logic devices, as well as any other type of processing device, combinations, or variations thereof.

Storage system 530 can comprise any computer readable storage media readable by processing system 520 and capable of storing software 532. Storage system 530 can include volatile and nonvolatile, removable and non-removable media implemented in any method or technology for storage of information, such as computer readable instructions, data structures, program modules, or other data. In addition to storage media, in some implementations storage system 530 can also include communication media over which software 532 can be communicated. Storage system 530 can be implemented as a single storage device but can also be implemented across multiple storage devices or sub-systems co-located or distributed relative to each other. Storage system 530 can comprise additional elements, such as a controller, capable of communicating with processing system 520. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof, or any other type of storage media. In no case is the storage media a propagated signal.

Software 532 can be implemented in program instructions and among other functions can, when executed by host system 500 in general or processing system 520 in particular, direct host system 500 or processing system 520 to instruct data storage devices to write, erase, or retrieve data on computer-readable media, such as phase change media devices, control transfer of data from one data storage device to another data storage device, setup and maintain storage arrays, report performance information to a user interface system or to other systems, among other operations. Software 532 can include additional processes, programs, or components, such as operating system software, database software, or application software. Software 532 can also comprise firmware or some other form of machine-readable processing instructions executable by processing system 520.

In at least one implementation, the program instructions can include first program instructions that direct processing system 520 to instruct data storage devices to write, erase, or retrieve data on computer-readable media, such as phase change media devices, control transfer of data from one data storage device to another data storage device, setup and maintain storage arrays, report performance information to a user interface system or to other systems, among other operations.

In general, software 532 can, when loaded into processing system 520 and executed, transform processing system 520 overall from a general-purpose computing system into a special-purpose computing system customized to instruct data storage devices to write, erase, or retrieve data on computer-readable media, such as phase change media devices, control transfer of data from one data storage device to another data storage device, setup and maintain storage arrays, report performance information to a user interface system or to other systems, among other operations. Encoding software 532 on storage system 530 can transform the physical structure of storage system 530. The specific transformation of the physical structure can depend on various factors in different implementations of this description. Examples of such factors can include, but are not limited to the technology used to implement the storage media of storage system 530 and whether the computer-storage media are characterized as primary or secondary storage. For example, if the computer-storage media are implemented as semiconductor-based memory, software 532 can transform the physical state of the semiconductor memory when the program is encoded therein. For example, software 532 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

Optional user interface system 540 includes equipment and circuitry for receiving user input and control, such as for engaging in storage management operations, displaying error rate or areal density information, among other operations. Examples of the equipment and circuitry for receiving user input and control include push buttons, touch screens, selection knobs, dials, switches, actuators, keys, keyboards, pointer devices, microphones, transducers, potentiometers, non-contact sensing circuitry, accelerometers, web interfaces, software interfaces, or other human-interface equipment. User interface system 540 also includes equipment to communicate information to a user of host system 500. Examples of the equipment to communicate information to the user could include displays, indicator lights, lamps, light-emitting diodes, haptic feedback devices, audible signal transducers, speakers, buzzers, alarms, vibration devices, or other indicator equipment, including combinations thereof.

Bus 550 comprises a physical, logical, or virtual communication link, capable of communicating data, control signals, and communications, along with other information. In this example, bus 550 also includes elements such as wires, circuit board traces, solid state interconnect, or other elements. In some examples, portions of bus 550 are encapsulated within the elements of host system 500, and can be a software or logical link. In other examples, bus 550 uses various communication media, such as air, space, metal, optical fiber, or some other signal propagation path, including combinations thereof. Bus 550 could be a direct link or might include various equipment, intermediate components, systems, and networks.

Figure 6:
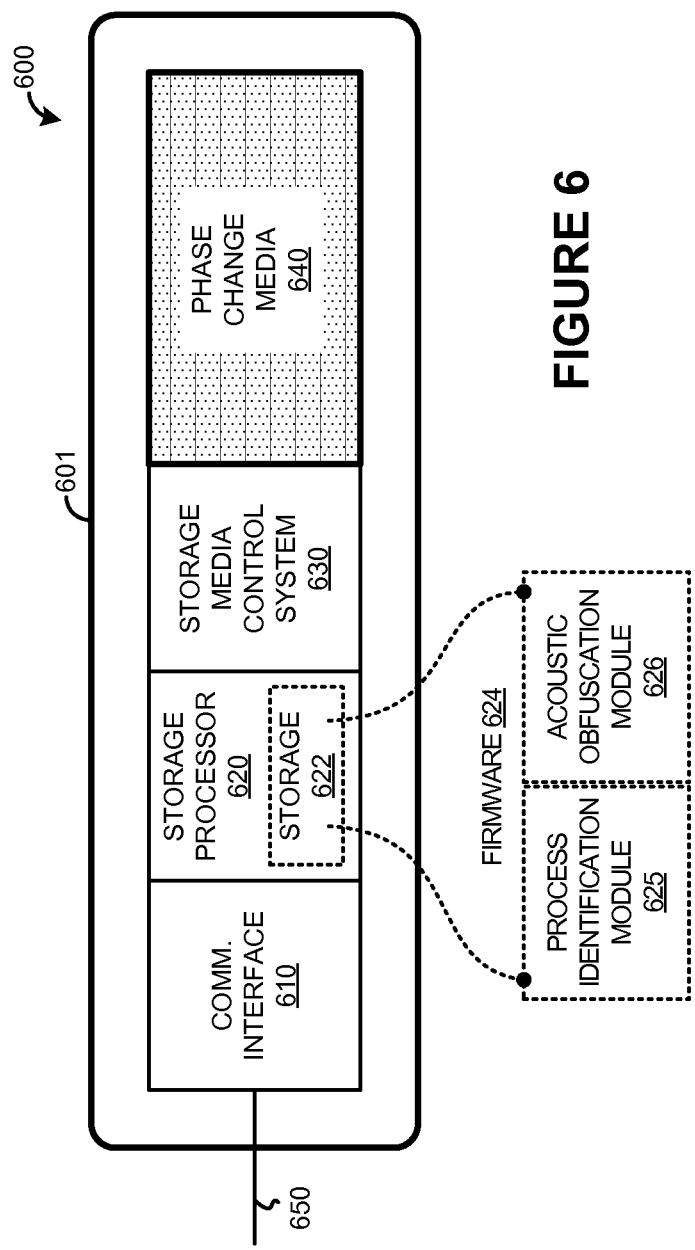
FIG. 6 is a block diagram illustrating a data storage device.

FIG. 6 is a block diagram illustrating data storage device 600. Data storage device 600 can include equipment and systems as discussed herein for data storage device 110 in FIG. 1 and phase change storage device 330 in FIG. 3, although variations are possible. Data storage device 600 includes communication interface 610, storage processor 620, storage media control system 630, and phase change media 640. In operation, storage processor 620 is operatively and communicatively linked to at least communication interface 610, storage media control system 630, and phase change media 640. It should be understood that discrete links can be employed, such as individual communication, power, and control links or other circuitry. Data storage device 600 can be distributed or consolidated among equipment or circuitry that together forms the elements of data storage device 600. Data storage device 600 can include enclosure 601 which can enclose or structurally support ones of the elements of data storage device 600. Data storage device 600 can optionally include additional devices, features, or functionality not discussed here for purposes of brevity.

Communication interface 610 includes one or more interfaces for communicating with communication networks, storage data busses, storage data links, or other devices, such as bus 130 of FIG. 1 or links 340-341 of FIG. 3. The interfaces can include any serial or parallel digital interfaces, or other communication and data interfaces, including combinations, variations, and improvements thereof. Examples of communication interface 610 include logic, transmission gates, buffers, network interface card equipment, transceivers, and other communication circuitry. In this example, communication interface 610 communicates over at least link 650. Link 650 can include any communication link as described herein, such as that described for links 130 in FIG. 1 or links 340-341 in FIG. 3.

Storage processor 620 can comprise one or more microprocessors, microcontrollers, system-on-a-chip devices, application specific integrated circuit (ASIC) processors, or FPGA elements and other circuitry that retrieves and executes firmware 624 from storage system 622. Storage processor 620 can be implemented within a single processing device but can also be distributed across multiple processing devices or sub-systems that cooperate in executing program instructions. Examples of storage processor 620 include general purpose central processing units, application specific processors, and logic devices, as well as any other type of processing device, combinations, or variations thereof.

Storage system 622 can include any computer readable storage media readable by storage processor 620 and capable of storing firmware 624, such as a computer readable storage device. The computer readable storage media that stores firmware 624 can include volatile and nonvolatile, removable and non-removable media implemented in any method or technology for storage of information, such as computer readable instructions, data structures, program modules, or other data. In addition to storage media, in some implementations the computer readable storage media can also include communication media over which firmware 624 can be communicated. The computer readable storage media that stores firmware 624 can be implemented as a single storage device, but can also be implemented across multiple storage devices or sub-systems co-located or distributed relative to each other. The computer readable storage media that stores firmware 624 can comprise additional elements, such as a controller, capable of communicating with storage processor 620. Examples of storage media include random access memory, read only memory, flash memory, or any other medium which can be used to store the desired information and that can be accessed by an instruction execution system, as well as any combination or variation thereof, or any other type of storage media. In no case is the storage media a propagated signal.

Firmware 624 can be implemented in program instructions and among other functions can, when executed by data storage device 600 in general or storage processor 620 in particular, direct data storage device 600 or storage processor 620 to receive modify, read, write, and erase commands and data from a host system, identify a modify process for modifying data stored on phase change media to at least secure an acoustic signal associated with modifying the data on the phase change media, modify the data on the phase change media in accordance with the modify process, modify bits of the data out of order on the phase change media, modify bits of the data concurrent with bits of further data on the phase change media, and modify bits the data repetitively on the phase change media, among other operations. Firmware 624 can include additional processes, programs, or components, such as operating system software, database software, or application software. Firmware 624 can also comprise some other form of machine-readable processing instructions executable by storage processor 620.

In at least one implementation, firmware 624 includes process identification module 625 and acoustic obfuscation module 626. Process identification module 625 can identify command types received by communication interface 610 and determine which command or operation to process data to store on or data to retrieve from phase change media 640. Process identification module 625 can also select among various types of obfuscation processes, such as described herein including obfuscated write ordering, concurrent writing, repetitive writing, encrypted writing, obfuscated erase ordering, concurrent erasing, repetitive erasing, among other processes, including combinations thereof. Once a process has been selected by process identification module 625, acoustic obfuscation module 626 can identify a particular ordering of operations to obfuscate an acoustic signature associated with the selected process. Acoustic obfuscation module 626 can determine an ordering of bits in writes and erases, a number of bits to write or erase concurrently, or a which bits to repetitively write or erase, among other operations, including combinations thereof.

In general, firmware 624 can, when loaded into storage processor 620 and executed, transform storage processor 620 overall from a general-purpose computing system into a special-purpose computing system customized to receive, modify, read, write, and erase commands and data from a host system, identify a modify process for modifying data stored on phase change media to at least secure an acoustic signal associated with modifying the data on the phase change media, modify the data on the phase change media in accordance with the modify process, modify bits of the data out of order on the phase change media, modify bits of the data concurrent with bits of further data on the phase change media, and modify bits the data repetitively on the phase change media, among other operations. Encoding firmware 624 on a computer readable storage media can transform the physical structure of the computer readable storage media. The specific transformation of the physical structure can depend on various factors in different implementations of this description. Examples of such factors can include, but are not limited to, the technology used to implement the storage media of the computer readable storage media and whether the computer readable storage media are characterized as primary or secondary storage. For example, if the computer-storage media are implemented as semiconductor-based memory, firmware 624 can transform the physical state of the semiconductor memory when the program is encoded therein. For example, firmware 624 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

Storage media control system 630 includes circuitry, devices, and equipment for transferring write data to phase change media 640 and reading data from phase change media 640. Storage media control system 630 can comprise amplifier circuitry, word line driver circuitry, heater element circuitry, laser control circuitry, step-up voltage converters, buffers, line amplifiers, and other circuitry and equipment.

Phase change media 640 includes phase change storage cells comprised of chalcogenide glass material among other semiconductor materials. Phase change media 640 can include one or more solid-state dies for storing data in an array of storage cells. In some examples, elements of communication interface 610, storage processor 630, and storage media control system 630 are included in phase change media 640, such as when phase change media cells are included on an integrated circuit along with elements of communication interface 610, storage processor 630, and storage media control system 630.

Returning to the elements of FIG. 1, data storage device 110 includes processing system 111 and one or more computer readable storage media such as phase change media 112 accessible by elements of data storage device 110. Processing system 111 is shown as an example of processing and interfacing elements of data storage device 110. Data storage device 110 can include further elements, such as those discussed for data storage device 600 in FIG. 6. Data storage device 110 can comprise phase change memory (PCM) device. The computer readable storage media of data storage device 110 includes phase change media 112, but can additionally include other media, such as employed in a cache or cache system of data storage device 110. These other media can include solid state storage media, optical storage media, magnetic media, phase change media, spin-based storage media, or other storage media, including combinations, variations, and improvements thereof. Phase change media 112 can employ various addressable schemes for access data stored thereon, such as bit addressable, byte addressable, word addressable, page addressable, or other data access granularities. Data storage device 110 also includes circuitry, devices, and equipment for transferring write data to phase change media 112 and reading data from phase change media 112. Data storage device 110 can comprise amplifier circuitry, word line driver circuitry, heater element circuitry, laser control circuitry, step-up voltage converters, buffers, line amplifiers, and other circuitry and equipment. Phase change media 112 includes phase change storage cells comprised of chalcogenide glass material among other semiconductor materials. Phase change media 112 can include one or more solid-state dies for storing data in an array of storage cells.

Host system 120 can include processing elements, data transfer elements, and user interface elements. In some examples host system 120 is a central processing unit of a computing device or computing system. In other examples, host system 120 also includes memory elements, data storage and transfer elements, controller elements, logic elements, firmware, execution elements, and other processing system components. In yet other examples, host system 120 comprises a RAID controller processor or storage system central processor, such as a microprocessor, microcontroller, Field Programmable Gate Array (FPGA), or other processing and logic device, including combinations thereof. Host system 120 can include, or interface with, user interface elements which can allow a user of storage system 100 to control the operations of storage system 100 or to monitor the status or operations of storage system 100. These user interface elements can include graphical or text displays, indicator lights, network interfaces, web interfaces, software interfaces, user input devices, or other user interface elements. Host system 120 can also include interface circuitry and elements for handling communications over bus 130, such as logic, processing portions, buffers, transceivers, and the like.

Bus 130 can include one or more serial or parallel data links, such as a Peripheral Component Interconnect Express (PCIe) interface, serial ATA interface, Serial Attached Small Computer System (SAS) interface, Integrated Drive Electronics (IDE) interface, ATA interface, Universal Serial Bus (USB) interface, wireless interface, Direct Media Interface (DMI), Ethernet interface, networking interface, or other communication and data interface, including combinations, variations, and improvements thereof. Although bus 130 is shown in FIG. 1, it should be understood that one or more discrete links can be employed between the elements of storage system 100.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A data storage device comprising:
   a communication interface configured to receive data for storage;
   phase change media on which to write the data;
   a processing system configured to identify a write sequence comprising writing bits of the data that have values of zero concurrently with bits of further data that have values of one and writing at least a portion of the data in a different order than received for storage by the data storage device to at least obfuscate an acoustic signature associated with the process of writing the data on the phase change media, wherein the acoustic signature comprises an ultrasonic acoustic signal generated by writing individual bits of the data to the phase change media, and
   the processing system configured to write the data to the phase change media in accordance with the write sequence.

2. The data storage device of claim 1, comprising:
   the processing system configured to identify a repetitive write sequence as a further write sequence that writes at least a portion of the data more than once to the phase change media to at least obfuscate the acoustic signature associated with writing the data on the phase change media.

3. The data storage device of claim 1, comprising:
   the processing system configured to identify an erase sequence to at least obfuscate an acoustic signature associated with erasing second data on the phase change media, and erase the second data on the phase change media in accordance with the erase sequence.

4. The data storage device of claim 3, comprising:
   the processing system configured to identify a repetitive erase sequence as the erase sequence that erases at least a portion of the second data more than once on the phase change media to at least obfuscate the acoustic signature associated with erasing the data on the phase change media.

5. The data storage device of claim 3, comprising:
   the processing system configured to identify third data to erase concurrently with the second data to at least obfuscate the acoustic signature associated with erasing the second data on the phase change media.

6. A storage processor, comprising:
   a communication interface configured to receive a write command to write data on phase change media;
   a processing system configured to control a write process in responsive to the write command to at least obfuscate an acoustic signature associated with the process of writing the data on the phase change media, wherein the write process comprises writing bits of the write data that have values of zero concurrently with bits of further data that have values of one and writing at least a portion of the write data in a different order than received for storage, and wherein the acoustic signature comprises an ultrasonic acoustic signal generated by writing individual bits of the write data to the phase change media.

7. The storage processor of claim 6, comprising:
   the processing system configured to identify a repetitive write sequence as a further write process that writes at least a portion of the data more than once to the phase change media to at least obfuscate the acoustic signature associated with writing the data on the phase change media.

8. The storage processor of claim 6, comprising: the processing system configured to identify an erase process to at least obfuscate an acoustic signature associated with erasing second data on the phase change media.

9. The storage processor of claim 8, comprising:
   the processing system configured to identify a repetitive erase sequence as the erase sequence that erases at least a portion of the second data more than once on the phase change media to at least obfuscate the acoustic signature associated with erasing the data on the phase change media.

10. The storage processor of claim 8, comprising:
    the processing system configured to identify third data to erase concurrently with the second data to at least obfuscate the acoustic signature associated with erasing the second data on the phase change media.

11. A method of operating a data storage processor, the method comprising:
    identifying a modify process for modifying data stored on phase change media to at least secure an acoustic signal associated with the process of modifying the data on the phase change media, wherein the modify process comprises modifying bits of the data that have values of zero concurrently with bits of further data that have values of one and modifying at least a portion of the data out of order on the phase change media, and wherein the acoustic signal comprises an ultrasonic acoustic signal generated by modifying individual bits of the data on the phase change media; and
    modifying the data on the phase change media in accordance with the modify process.

12. The method of claim 11, wherein the modify process further comprises modifying ones of the bits the data repetitively on the phase change media.

* * * * *